United States Patent

Renard et al.

[15] 3,702,956

[45] Nov. 14, 1972

[54] JOSEPHSON JUNCTIONS

[72] Inventors: Michel Renard; Philippe Cardinne; Bernard Manhes, all of Grenoble, France

[73] Assignee: L'Air Liquide Societe Anonyme Pour L'Etude et L'Exploitation des Procedes Georges Claude, Paris, France

[22] Filed: April 7, 1971

[21] Appl. No.: 132,051

[30] Foreign Application Priority Data

April 13, 1970 France......................7013204

[52] U.S. Cl..........317/234 R, 317/234 T, 317/234 S, 331/107 S, 317/235 UA, 307/306

[51] Int. Cl...............................H01l 3/00, H01l 5/00

[58] Field of Search.....317/234 S, 234 T, 235 B, 235 UA; 331/107 S; 307/306

[56] References Cited

UNITED STATES PATENTS

| | | | |
|---|---|---|---|
| 3,259,759 | 7/1969 | Giaever | 307/88.5 |
| 3,521,133 | 7/1970 | Beam | 317/234 |
| 3,564,351 | 2/1971 | McCumber | 317/234 |
| 3,600,644 | 8/1971 | Eck | 317/234 |

OTHER PUBLICATIONS

Schroen, Journal of Appl. Physics, 2 Vol., 39, No. 6, May 3 1968, pp. 2671-2673.

*Primary Examiner*—Martin H. Edlow
*Attorney*—Young & Thompson

[57] ABSTRACT

The invention relates to a Josephson type junction and, according to the invention, this is constituted by a layer 1 of semiconducting material inserted between two superconductors 2 and 3. These superconductors are chosen such that the Fermi level of these superconductors falls at the location of the contact with the semiconductor material externally of the forbidden gap of the said semi-conductor. Junctions according to the invention may be used in high frequency current techniques when a D.C. voltage is applied, thus permitting the manufacture of generators or receivers operating at high frequency.

18 Claims, 4 Drawing Figures

JOSEPHSON JUNCTIONS

The present invention relates to junctions of the Josephson type.

It is known that such junctions are formed from two members of superconductive metal separated by an insulating barrier layer which is sufficiently thin to permit the passage of electrons by the tunnel effect. When a voltage is applied between the two superconductive members, an alternating current is created between the latter, the frequency of which depends upon the amplitude of the voltage ($f = 2e\ (V/h)$, $e$ and $h$ being constants).

This insulating barrier is usually made from the oxide of one of the superconductive metals and the thickness of which is necessarily very small, e.g. of the order of 10 to 20 A. Thus, the junction is extremely fragile and is not very reliable, the characteristics developing as a function of the time, heat cycles, influence of the electric field, etc. The techniques of making such very thin barriers are, moreover, empirical and not reproducible. For example, the formation of a layer of oxide over a film of lead may be effected by exposing the film of lead to a gaseous medium containing oxygen and to gaseous discharge in an oxygen atmosphere. The oxides formed are not always well-defined nor stable. It has been proposed to use a thick barrier, of the order of 50 A, no longer simply an insulating layer but having cadmium sulphide, a semi-conductor body comprised between the two superconductive materials; however, the appearance of a certain Josephson effect was only achieved by causing excitation of the barrier by radiation from the outside. This renders the operation impractical and considerably limits the advantage of the junction. The essential advantage of the use of a barrier made of a semi-conductor material resides in the possibility of making the barrier appreciably thicker than an insulated barrier.

One object of the invention is to provide the conditions in which a junction of the Josephson type may operate correctly with a barrier produced from a semi-conductor material, and without the necessity for using any source of light power for excitation.

Another object of the invention is to form a junction of the Josephson type which is reliable and not delicate to produce. Furthermore, another object of the invention is a Josephson junction whose impedance is adjustable.

The invention stems from a theoretical examination of the phenomena which occur at a location of a contact between a superconductive metal and a semi-conductor body. It is known that, even in a body maintained at a very low temperature, the largest proportion of electrons move at energy levels less than a maximum energy level referred to as the Fermi level. In order to extract an electron from the metal, it is necessary to supply, at least, energy referred to as the extraction potential, which enables an electron at the Fermi level to be passed into an energy state which enables its withdrawal from the metal. In a semi-conductor body, moreover, there can be established a discontinuity, referred to as the "forbidden gap" which corresponds to a form of energy which cannot be preserved by the electrons due to resonance in the crystalline network of the semi-conductor.

It is from these data which have been summarized and outlined above very briefly, that a junction of the Josephson type has been devised, having a semi-conduccot or barrier which must necessarily be produced from a barrier of a semi-conductor material chosen so that, from the point of view of the energy level of the electrons, the Fermi level of the metal drops, at the location of the contact with the semi-conductor material, outside the forbidden gap of the said semi-conductor. However, in such a junction obeying one of the two necessary criteria $$(\phi_S - \phi_M > \Delta \text{ or } \phi_M > \phi_S,$$

where $\phi_M$ is the extraction potential of the super conductor; $\phi_S$ is the extraction potential of the semi-conductor; $\Delta$ the forbidden gap ), the electrons of the superconductive metal would flow in the conduction or empty band of the semi-conductor if the extraction potential of the semi-conductor is greater than the potential of the superconductive by a value at least equal to the energy range of the forbidden gap of the said semi-conductor or, moreover, the electrons of the valence band of the semi-conductor would flow in the zone of conduction of the superconductive metal if the superconductive extraction potential is greater than the extraction potential of the semi-conductor. In fact, as will be seen hereinafter in more detail, the passage of electrons does not occur exactly directly, which would form a short circuit: In fact, under the effect of space charges, the forbidden gap is deformed by curving towards the Fermi level of the metal so that the electrons only pass by tunnel effect. In the event that one or the other of these two conditions is not fulfilled, i.e. in the case where the Fermi level of the superconductive metal drops, at the location of the contact with the Fermi conductor, in the forbidden gap of the semiconductor, the passage of electrons from the superconductor to the semi-conductor and vice versa is not possible and no Josephson effect can be detected, unless a force of external origin is communicated to the electrons in the semi-conductor which changes the distribution of the diagrams, as is the case of the prior state of the aforementioned art relating to a cadmium sulphide junction placed between two lead superconductors. In fact, in such a case, the extraction potential and the forbidden gap of the cadmium sulphide are respectively:

$$\phi_S \cong 4.2\ eV$$

$$\Delta S \cong 2.4\ eV$$

whilst the extraction potential of the lead is:

$$\phi_M = 4.0$$

and it is thus verified that:

$$\phi_S - \Delta < \phi_M < \phi_S.$$

It is thus established that, in the case of a Pb-Cds-Pb junction, the conditions referred to above for the appearance of a Josephson effect are not fulfilled unless supplementary energy of external origin is injected.

It is due to this choice of materials forming the junction, a choice which enables a transfer of electrons, that barriers can be formed from semi-conductor materials of somewhat greater thickness than the limited thickness of insulating barriers. There is no advantage, for the reasons already stated, in producing a barrier below 100 A, but it has proved also practically impossible to produce such a barrier having a thickness of 1,000 A, since the probability of transition by the tunnel effect thus becomes extremely slight. In practice, a suitable thickness is one of several hundreds of Angstrom units, for example 300 A.

In order that the invention may be more clearly understood, reference will now be made to the accompanying drawings which show some embodiments thereof by way of example, and in which.

Figure 1:
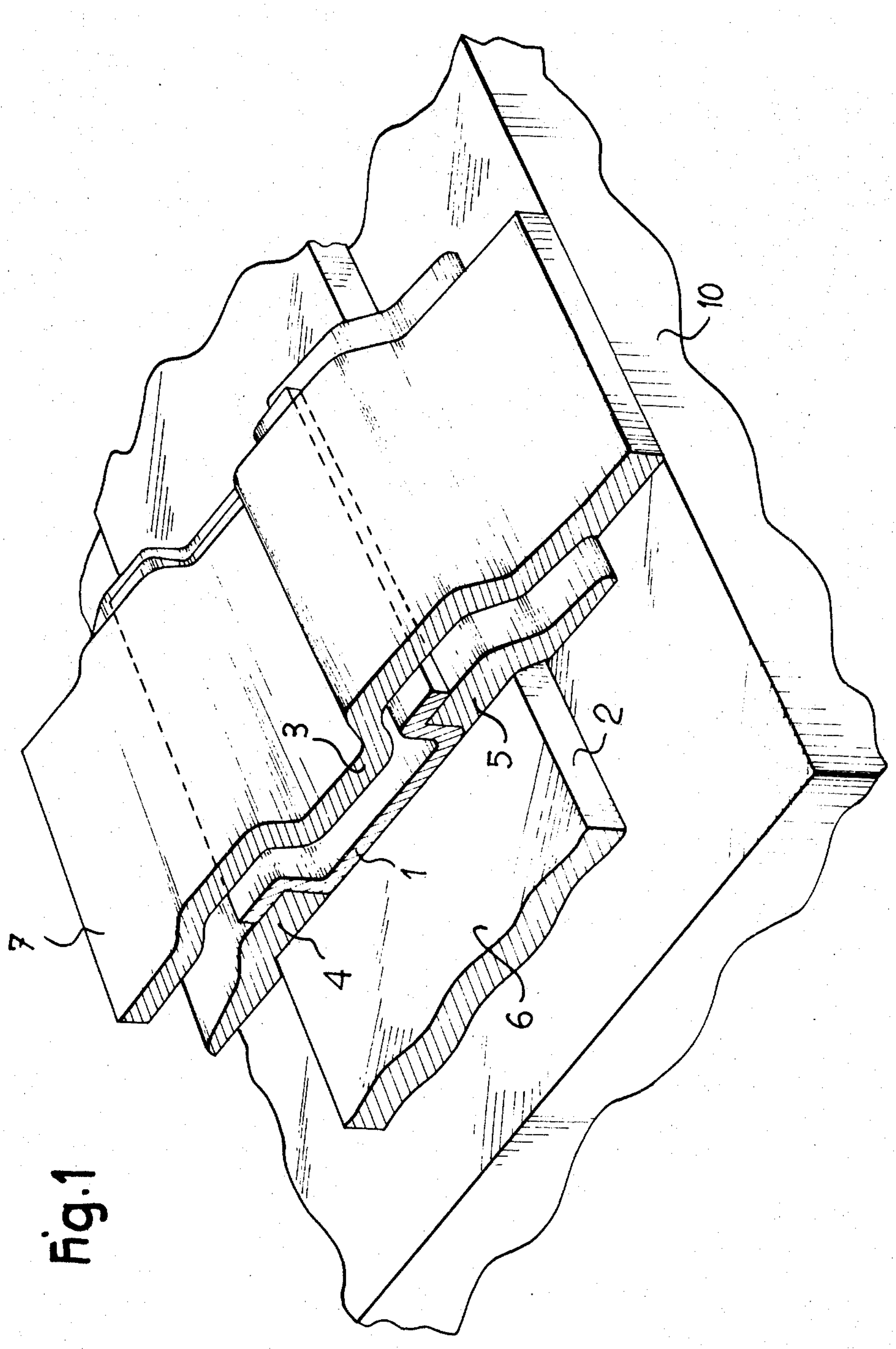
FIG. 1 is a schematic view of a junction according to the invention.

Referring first of all to FIG. 1, this shows a junction formed on an insulating support 10, by a film or layer 1, of semi-conductor material having a thickness of between 100 and 1,000 A, enclosed between two strips of superconductive material 2 and 3, the film 1 being laterally defined by insulating protective films 4 and 5. The film has to be produced with care by using conventional techniques relating to the fashioning of films as continuously as possible. To one end 6 of the strip 2 is connected a terminal of a current source, whilst the other terminal of the current source is connected at another end 7 of the strip 3. The film 1 and strips 2 are formed by any desired process, for example by vaporization in vacuum or cathode projection.

Figure 2:
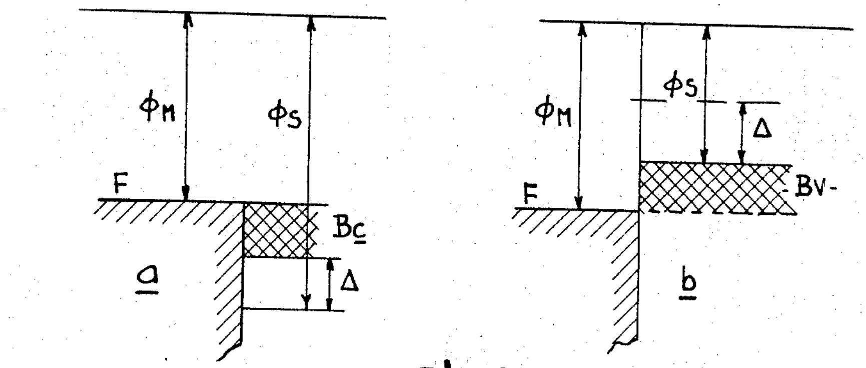
FIG. 2 shows energy diagrams of the metal - semiconductor - metal junction.
Figure 3:
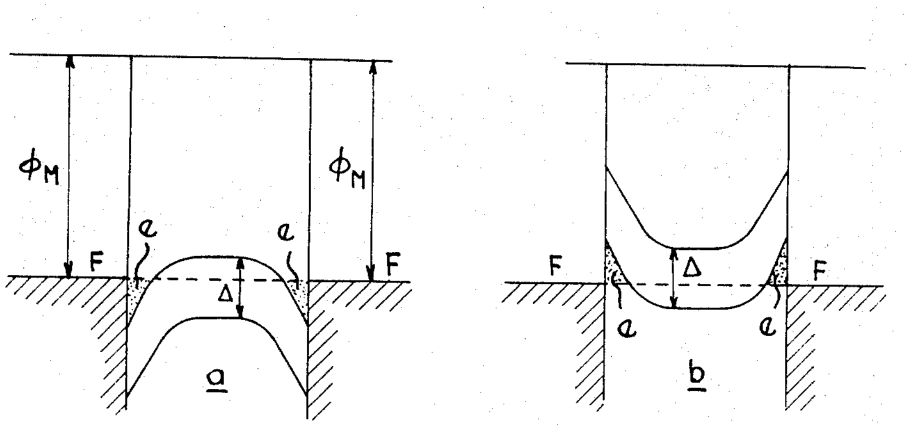
FIG. 3 shows actual diagrams of a metal - semi-conductor - metal junction.

Referring to FIG. 2, there is shown at *a* a junction where the extraction potential $\phi_M$ of the superconductive metal is less than the difference of the extraction potential of the semi-conductor $\phi_S$ decreased in power corresponding to the forbidden gap Δ; in such a case, the conduction (empty) band $B_c$ of the semiconductor serves as a receptacle for the electrons arriving from the superconductive metal. In the diagram shown at *b* in FIG. 2, it can be seen that the extraction potential $\phi_M$ of the superconductive metal is greater than the extraction potential $\phi_S$ of the semi-conductor so that the electrons from the valence (filled) band $B_c$ of the semi-conductor flow towards the conduction area of the superconductive metal. In both cases, the Fermi level F of the superconductive metal is thus outside the forbidden gap Δ. It will be noted that the representation which has been made of the energy diagrams is a simplified representation which does not account for corresponding distortions due to space charges in the semiconductor material. In fact, as can be seen in FIG. 3, a Josephson type junction having a semi-conductor barrier according to the invention is greatly distorted: in FIG. **3*a* a junction of the type shown in FIG. 2*a* can be seen but wherein the forbidden gap Δ, initially below the Fermi level of the superconductive metal, is raised in its central part to be slightly above the Fermi level F of the superconductive metal. In FIG. 3*b*, on the other hand, the forbidden gap Δ, initially above the Fermi level of the superconductive metal is deformed downwardly to be slightly below the Fermi level of the metal. These deformations are caused by the space charges of electrons localized in the parts indicated at *e*. It is due to this relatively slight intersection of the forbidden gap Δ with the Fermi level F, that the tunnel effect may be produced. Without entering into more detail of the theoretical phenomena, it is pointed out that the configurations necessary to obtain a tunnel effect of the forbidden gap of the semiconductor with respect to the Fermi level of the superconductor material, such as in FIGS. 3*a* and 3*b*, can only be obtained by careful choice of the semi-conductor and superconductor such that the forbidden gap Δ of the first is located outside the Fermi level of the second, as shown in FIGS. 2*a* and 2*b***.

By way of example and in a non-limiting manner, there is given hereinafter a table having a double entry, i.e. horizontal rows showing the superconductors with an extraction potential and vertical columns showing the semi-conductors with their forbidden gap Δ, extraction potential measured in thermionic fashion $\phi_S$ or photoelectric fashion $\Phi_S$. Simple examination of these two entries permits confirmation of whether the junction formed by any superconductor in the horizontal rows and of any semi-conductor in the vertical columns enables an effect of the Josephson type to be obtained (in which event "yes" is written at the intersection of the two selected members) or no effect of this kind (in which case "no" is written).

| Semiconductors | | | | Superconductors | | | | | | | |
|---|---|---|---|---|---|---|---|---|---|---|---|
| | $\Delta_S$ | $\varphi_S$ | $\phi_S$ | La 3.3 | Pb or Nb 4.0 | Sn 3.7 | Ta 4.16 | V 4 | Re 5 | Tl 3.7 | $\phi_M$ |
| Te | 0.33 | 4.76 | 4.90 | Yes | Yes | Yes | Yes | Yes | Yes | Yes | |
| Seβ | 1.74 | 5.11 | | Yes | No | No | No | No | | No | |
| $Na_3SB$ | 1.1 | 2.24 | | Yes | Yes | Yes | Yes | Yes | Yes | Yes | |
| GaAs | 1.53 | 4.69 | 4.99 | Yes | No | | No | No | Yes | | |
| InSb | 0.27 | 4.57 | 4.77 | Yes | Yes | Yes | Yes | Yes | Yes | Yes | |
| SiC | 2.68–2.2 | 7 | | Yes | Yes | Yes | | Yes | No | Yes | |
| NiO | 2.38 | 4.19 | | No | No | No | | No | Yes | No | |
| PbTe | 0.19 | | ~4.8 | Yes | Yes | Yes | Yes | Yes | Yes | Yes | |
| Ge | 0.75 | | 4.3 / 4.8 | Yes | | Yes | No | | Yes | Yes | |

The steps advocated by the invention thus enable Josephson junctions to be formed of thicknesses of the order of 100 to 500 A. Not only is such a junction more stable and less fragile than a junction having an insulating barrier of 10 to 20 A, but it also becomes possible to manufacture it in a much easier fashion with the aid of conventional evaporation techniques under vacuum and cathode sputtering.

In the case where the appearance of alternating current of high frequency in the junction behaves like a resonating structure wherein electro-magnetic waves are established and moved. Such a structure is obviously extremely assymmetrical, since its thickness is at least 100 times less than its other dimensions, so that the characteristic impedance of such a junction is several thousand times smaller than the no-load impedance. However, with the junctions according to the invention which enable substantially thicker barriers, mismatching, which is enormous in a junction having an insulating layer of 10 to 20 A, is reduced by 3 to 4 times.

Figure 4:
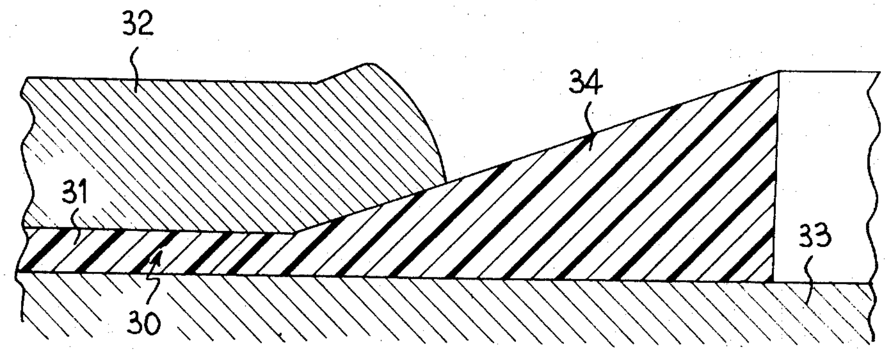
FIG. 4 is a view in section of a modification of the junction according to the invention.

In order to further reduce the mismatch between the junction and the exterior, so as to enable suitable transmission of power, an overflow 34 of the semi-conductor having a progressively increasing thickness, as is shown on FIG. 4, may be formed externally of the inset area 30 of the semi-conductor film 31 inserted between the superconductive strips 32 and 33. The increase in thickness may be from 10 to 100 times and preferably it is effected linearly so that the local impedance there is continuous so as to avoid the formation of reflection waves. In this manner, the power can be conveyed with the minimum of losses to a conventional propagation structure. Furthermore, the mismatch may thus be reduced to a large extent, in any case by a factor of 100. This lateral overflowing part of the barrier can be produced by the conventional techniques of evaporation and cathode projection preferably simultaneously with the formation of the useful inset part; it is sufficient to provide masks of suitable shape, these masks being movable at constant or variable speeds which enables a linear or non-linear increase to be obtained for any desired profile.

The applications of these junctions are more particularly useful in high frequency operations, either in the form of generators or electro-magnetic receivers.

We claim:

1. A junction of the Josephson type comprising two members of superconductive metal, and between said members a layer of semi-conductor material such that the Fermi level of the superconductive metal drops at the location of the contact with the semi-conductor material externally of the forbidden gap of the said semi-conductor material.

2. A junction according to claim 1, wherein the extraction potential of the superconductive metal is greater than the extraction potential of the semi-conductor material.

3. A junction according to claim 1, wherein the extraction potential of the superconductive metal is lower than the extraction potential of the semi-conductor material decreased by the energy of the forbidden gap of the said semi-conductor material.

4. A junction according to claim 1, wherein the thickness of the semi-conductor layer between the members made of superconductive metal is between 100 A and 1,000 A.

5. A junction according to claim 1, wherein said semi-conductive layer is tellurium (Te) and said superconductive members are a metal selected from the group consisting of lanthanum (La), lead (Pb), niobium (Nb), tin (Sn), tantalum (Ta), vanadium (V), rhenium (Re) and thallium (Tl).

6. A junction according to claim 1, wherein said semi-conductor layer is Selenium $\beta$ (Se $\beta$ ), and said superconductive members are lanthanum (La).

7. A junction according to claim 1, wherein said semi-conductor layer is an $Na_3Sb$ alloy and said superconductive members are a metal selected from the group consisting of lanthanum (La), lead (Pb), niobium (Nb), tin (Sn), tantalum (Ta), vanadium (V), rhenium (Re) and thallium (Tl).

8. A junction according to claim 1, wherein said semi-conductor layer is a Ga As alloy, and said superconductive members are a metal selected from the group consisting of lanthanum (La) and rhenium (Re).

9. A junction according to claim 1, wherein said semi-conductor layer is an InSb alloy, and said superconductive members are a metal selected from the group consisting of lanthanum (La), lead (Pb), tin (Sn), tantalum (Ta), vanadium (V), rhenium (Re) and thallium (Tl).

10. A junction according to claim 1, wherein said semi-conductor layer is silicon carbide (SiC) and said superconductive members are a metal selected from the group consisting of lanthanum (La), lead (Pb), tin (Sn), vanadium (V), thallium (Tl) and niobium (Nb).

11. A junction according to claim 1, wherein said semi-conductor layer is nickel oxide (NiO) and said superconductive members are rhenium (Re).

12. A junction according to claim 1, wherein said semi-conductor layer is a PbTe alloy and said superconductive members are a metal selected from the group consisting of lanthanum (La), lead (Pb), niobium (Nb), tin (Sn), tantalum (Ta), vanadium (V), rhenium (Re) and thallium (Tl).

13. A junction according to claim 1, wherein said semi-conductor layer is germanium (Ge), and said superconductive members are a metal selected from the group consisting of lanthanum (La), tin (Sn), rhenium (Re) and thallium (Tl).

14. A junction according to claim 4, wherein said semi-conductor layer has a lateral overflow of increasing thickness.

15. A junction according to claim 14, wherein the variation of thickness of said extension is constant per unit length.

16. A junction according to claim 14, wherein the increase in thickness at the location of the lateral overflow is about one hundredfold.

17. A junction according to claim 1, wherein said superconductive members and said semi-conductor layer are vapor deposited.

18. A junction according to claim 1, wherein said superconductive members and said semi-conductor layer are deposited by cathodic sputtering.

* * * * *